United States Patent [19]

Matsuoka et al.

[11] Patent Number: 5,312,267
[45] Date of Patent: May 17, 1994

[54] SOCKET FOR THE USE OF ELECTRIC PART

[75] Inventors: Noriyuki Matsuoka, Yokohama; Masanori Egawa, Sendai, both of Japan

[73] Assignee: Yamaichi Electric Co., Ltd., Tokyo, Japan

[21] Appl. No.: 876,461

[22] Filed: Apr. 30, 1992

[30] Foreign Application Priority Data

Apr. 30, 1991 [JP] Japan .................................. 3-126697

[51] Int. Cl.[5] .......................................... H01R 13/62
[52] U.S. Cl. ...................................... 439/331; 439/70; 439/487; 361/671
[58] Field of Search .................. 439/73, 92, 181, 108, 439/330, 331, 610, 736, 485, 487, 68-72; 361/381, 386, 388

[56] References Cited

U.S. PATENT DOCUMENTS

| | | | |
|---|---|---|---|
| 2,279,866 | 4/1942 | Ellinwood | 439/736 |
| 4,427,247 | 1/1984 | Petersen | 439/92 |
| 4,547,031 | 10/1985 | Kovsunsky | 439/73 |
| 4,555,157 | 11/1985 | Johnson et al. | 439/76 |
| 4,582,384 | 4/1986 | Frantz et al. | 439/610 |
| 4,717,346 | 1/1988 | Yoshizaki | 439/331 |
| 4,758,176 | 7/1988 | Abe et al. | 439/72 |
| 5,046,967 | 9/1991 | Majernik et al. | 439/736 |
| 5,109,980 | 5/1992 | Makmoka et al. | 439/73 |

*Primary Examiner*—Larry I. Schwartz
*Assistant Examiner*—Hien D. Vu
*Attorney, Agent, or Firm*—Wenderoth, Lind & Ponack

[57] ABSTRACT

A socket for receiving an electric part has a presser cover openably and closably connected to a socket body through a pivotal hinge. Metal frames are embedded in a synthetic resin frame defining an opening in the presser cover at the position of the electric part. The metal frames can be used as bearing portions of the pivotal hinge. Holes in the presser frame through which the metal frames are exposed permit the metal frames to act as a static electricity discharging device.

2 Claims, 5 Drawing Sheets

SOCKET FOR THE USE OF ELECTRIC PART

BACKGROUND OF THE INVENTION

This invention relates to a socket for receiving an electric part, in which a cover is closed on a socket body so as to hold an electric part such as an IC and to maintain a contact relation.

Heretofore, there has been known an IC socket, in which a presser cover is openably and closably connected to one end of a socket body by a pivotal hinge, and the presser cover is closed on the socket body and then a lock member mounted on the other end of the socket body is engaged with the other end of the presser cover, or a lock member mounted on the other end of the presser cover is engaged with the other end of the socket body, thereby holding the IC in position on the socket body. When the presser cover is closed on the socket body, IC leads are pushed down and urged against corresponding contacts on the socket body by a lead presser member mounted on the presser cover, thereby flexing the contacts against elasticity thereof in order to obtain a contact pressure by their resilient reactions. An opening for discharging heat is formed in the presser cover at a location corresponding to an IC mounting portion (i.e., portion where the IC is placed).

The socket body and the presser cover, respectively, are formed of separate integrally molded parts of a synthetic resin material. The pivotal hinge comprises a metal shaft or the like, inserted into a knuckle joint integrally molded on corresponding ends of the socket body and presser cover. The lead presser member comprises a pillow-like projection integrally formed on the presser cover in such a manner as to correspond to a row of the leads. Alternatively, a lead presser member having the pillow-like projection is formed as a separate part, and it is disposed within the heat discharging opening and pivotably supported on a resin frame forming the opening.

This conventional IC socket has the following problem. That is, a push-up force normally acts on the pressure cover from each of the contacts when the cover is closed on the socket body. Therefore, when the presser cover is subjected to a measurement test, etc. under the condition that the electric part is heated by, for example, the push-up force applied to the presser cover, or under a high temperature, the cover is gradually warped during repeated use thereof, by the push-up force and heat. Since the accuracy of the presser member becomes unreliable (that is, the presser member is subjected to error in accuracy), it becomes difficult to obtain a proper pushing pressure and a proper contact pressure for each of the IC leads.

It also has the problem that a socket of this type must be disposed of when the cover is warped even if the socket body is still in a good condition, and therefore, the socket has a very short service life and is thus uneconomical.

SUMMARY OF THE INVENTION

It is therefore an object of the present invention to provide, in order to solve the above problems, a socket for receiving an electric part, in which a resin frame forming a heat discharging opening portion in a presser cover is prevented from being warped.

To achieve the above object, a socket for receiving an electric part according to the present invention comprises a metal frame integrally embedded in a synthetic resin frame forming an opening portion in a presser cover and extending from a pivotal hinge end of the presser cover towards a free end thereof.

The metal frame may be used as a bearing portion for the pivotal hinge or a presser member. Alternatively, the metal frame may be used as a means for discharging static electricity.

When the presser cover is in its closed state, one end thereof is supported by the pivotal hinge and the other end (free end) thereof is supported by the lock member, an mentioned. In the foregoing state, the push-up force is applied to a central portion of the cover. As a result, the resin frame forming the opening portion in the presser cover may be warped in the direction of both the pivotal hinge end and the free end, and this warping becomes more significant when heat is applied thereto. However, since the metal frame is embedded in the resin frame and extends form the pivotal hinge end towards the free end (these two sides are readily warped as mentioned), the warping in that direction can be prevented effectively. Therefore, the above problems that the reliability with respect to the contact relation is lowered due to this warping and that the service life of the socket is short are readily overcome.

Furthermore, the metal frame, while serving as the means for preventing the warping of the resin frame, can also effectively serve as the bearing for the pivotal hinge and the pressure member, or as the means for discharging static electricity.

DETAILED DESCRIPTION OF THE EMBODIMENTS

The present invention will now be described in the form of preferred embodiments with reference to FIGS. 1 to 10.

Figure 1:
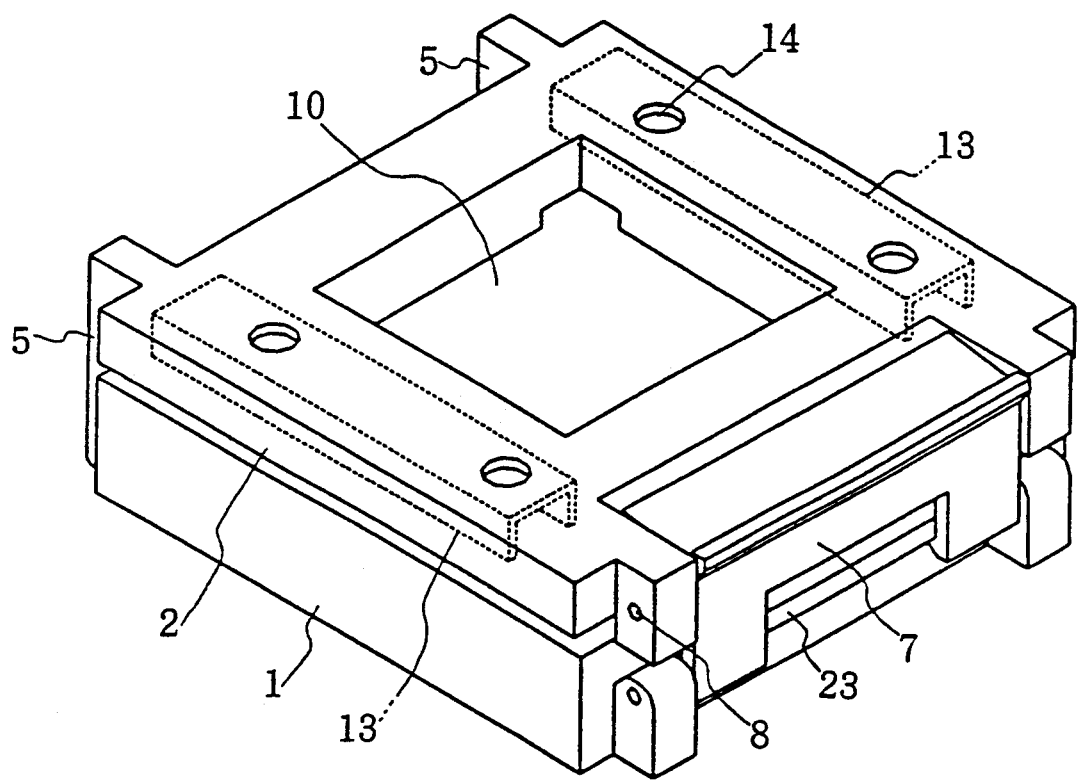
FIG. 1 is a perspective view of a socket for receiving an electric part showing a fundamental example of the present invention.
Figure 2:
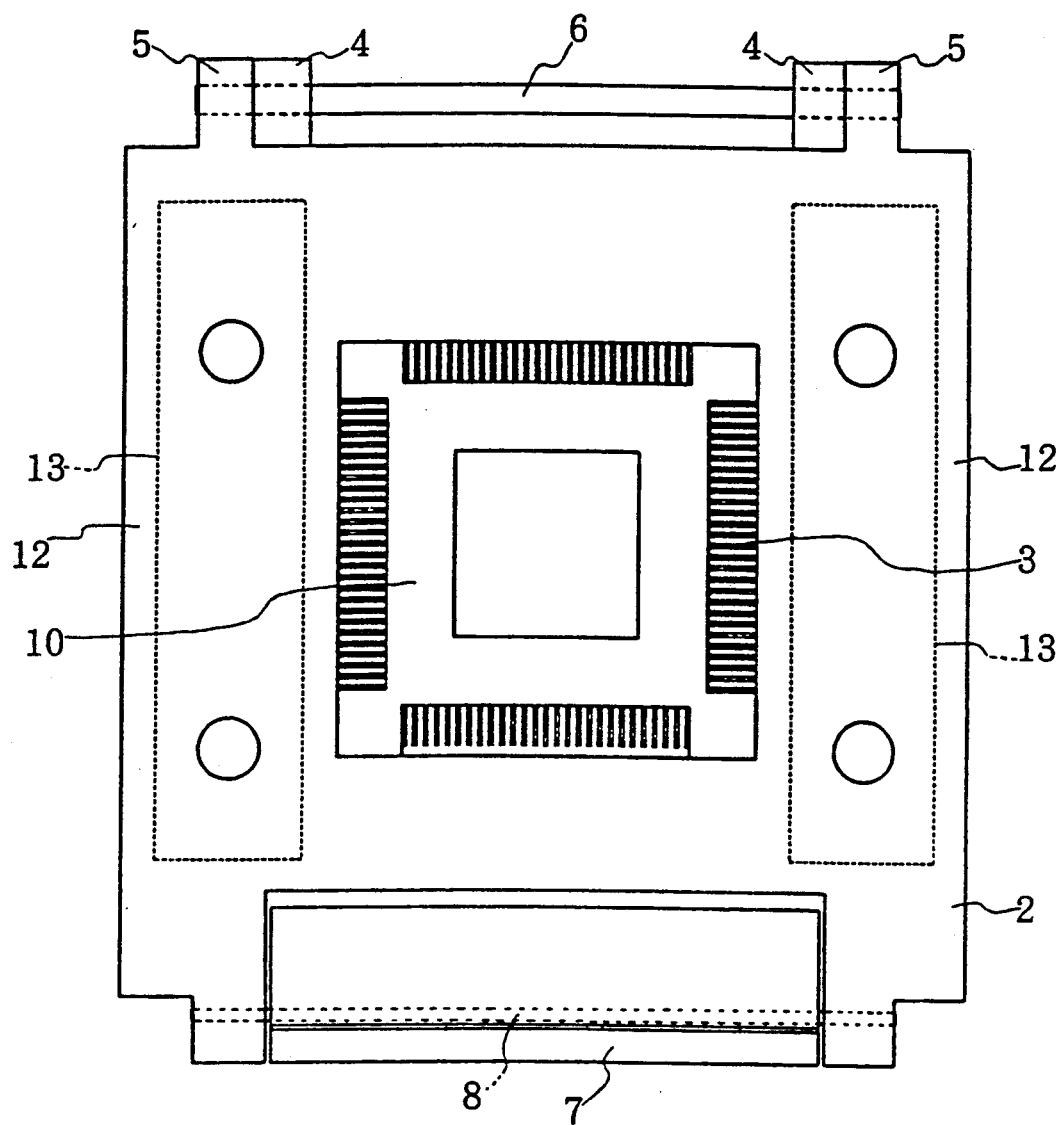
FIG. 2 is a plan view of the socket of FIG. 1.
Figure 3:
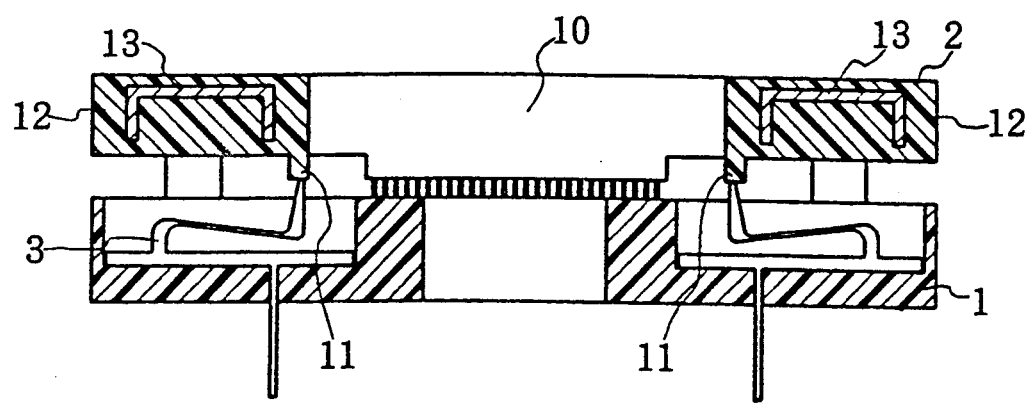
FIG. 3 is a sectional view of the socket of FIG. 1.
Figure 8:
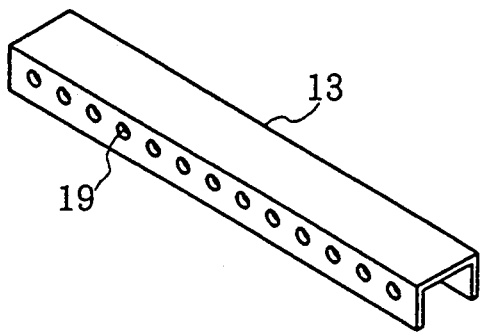
FIGS. 8 through 10 are perspective views respectively showing different embodiments of metal frames.
Figure 9:
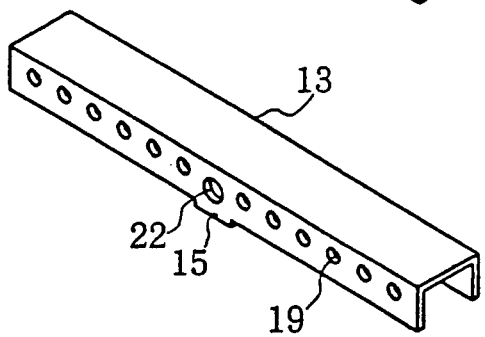
Figure 10:
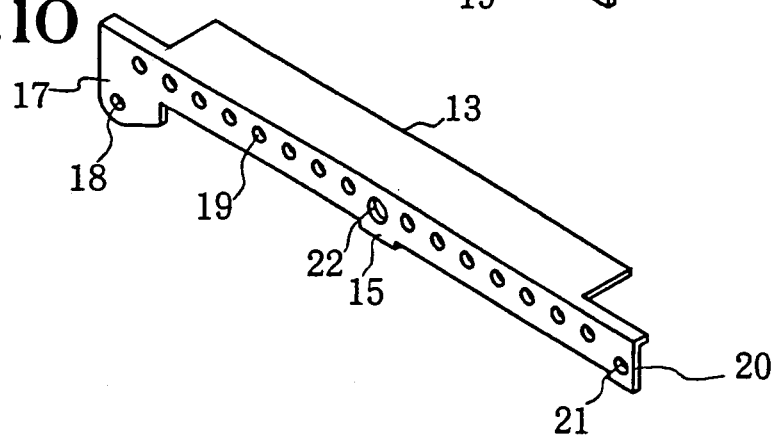

FIGS. 1 to 3 show a fundamental embodiment of a socket for receiving an electric part according to the present invention, and FIGS. 8 to 10 respectively show examples of metal frames to be used for the socket. First, a construction common to a first embodiment and a second embodiment will be described, and then the specific construction of each of them will be described.

The numeral 1 denotes a socket body having a plurality of contacts 3, and the numeral 2 denotes a presser cover. The presser cover 2 and the socket body 1 are integrally formed of synthetic resins, respectively. One end of the presser cover 2 is openably and closably connected to one end of the socket body 1 by a pivotal hinge. Joint portions 4 and 5 are integrally formed on one end of the socket body 1 and one end of the presser cover 2. The joint portions 4 and 5 are arranged in a staggered relation with each other, and a shaft 6 of a metal material is inserted through both of the joint portions 4 and 5, thereby forming the pivotal hinge.

The presser cover 2 is opened or closed with respect to the socket body 1 around the pivotal hinge. When the presser cover 2 is closed on the socket body 1, the cover pushes down leads (not shown) of the electric part placed on the socket body 1, and the leads, in turn, cause the corresponding contacts 3 to move downward against their elasticity, and a contact pressure is obtained between each of the contacts 3 and its corresponding lead by the resilient reaction, thereby holding the electric part on the socket body 1.

A means for maintaining the closed state of the presser cover 2 and for holding the electric part is provided in the form of a lock member 7 pivotably mounted on a free end of the presser cover 2 on a shaft 8, so that the lock member 7 is engaged with and disengaged from the other end of the socket body 1. The lock member 7 is pivotably connected to the opposite side of the socket body 1, so that the lock member 7 is engaged with and disengaged from the free end of the presser cover 2. A lock pin 23 for engagement and the disengagement of the lock member 7 is disposed in a longitudinal direction on the other end of the socket body.

Figure 4:
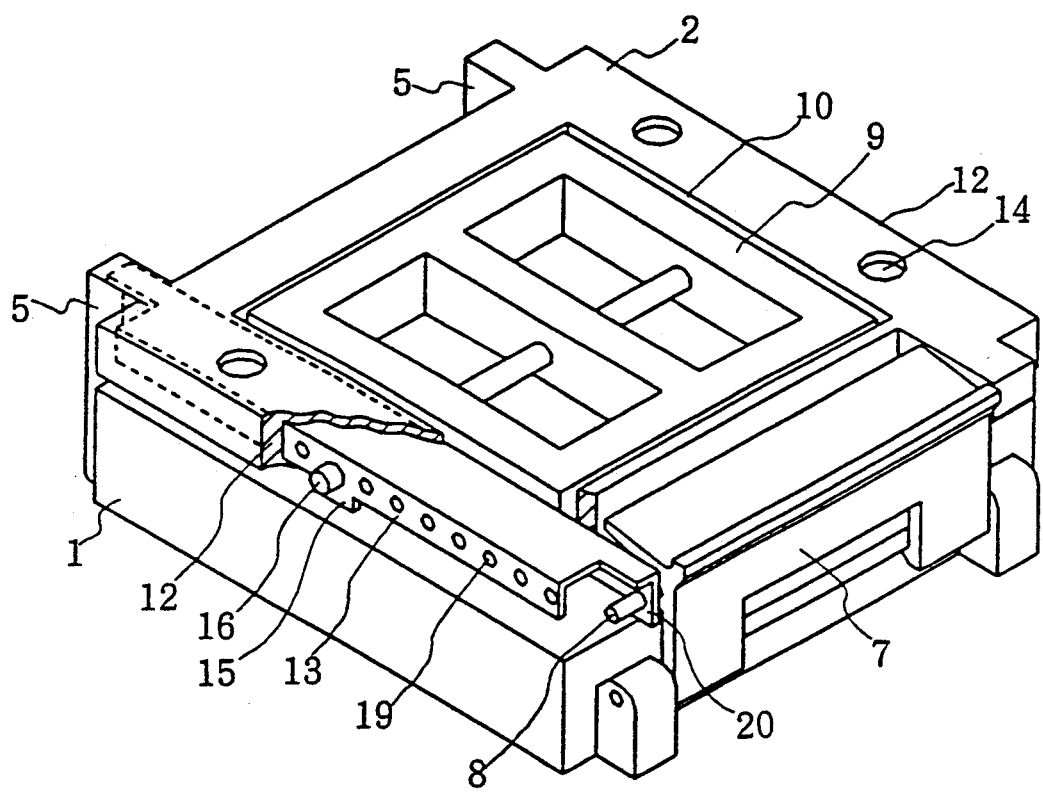
FIG. 4 is a perspective view, partly cut-away, of a modified embodiment in which other component parts are added to the fundamental structure of FIG. 1.
Figure 5:
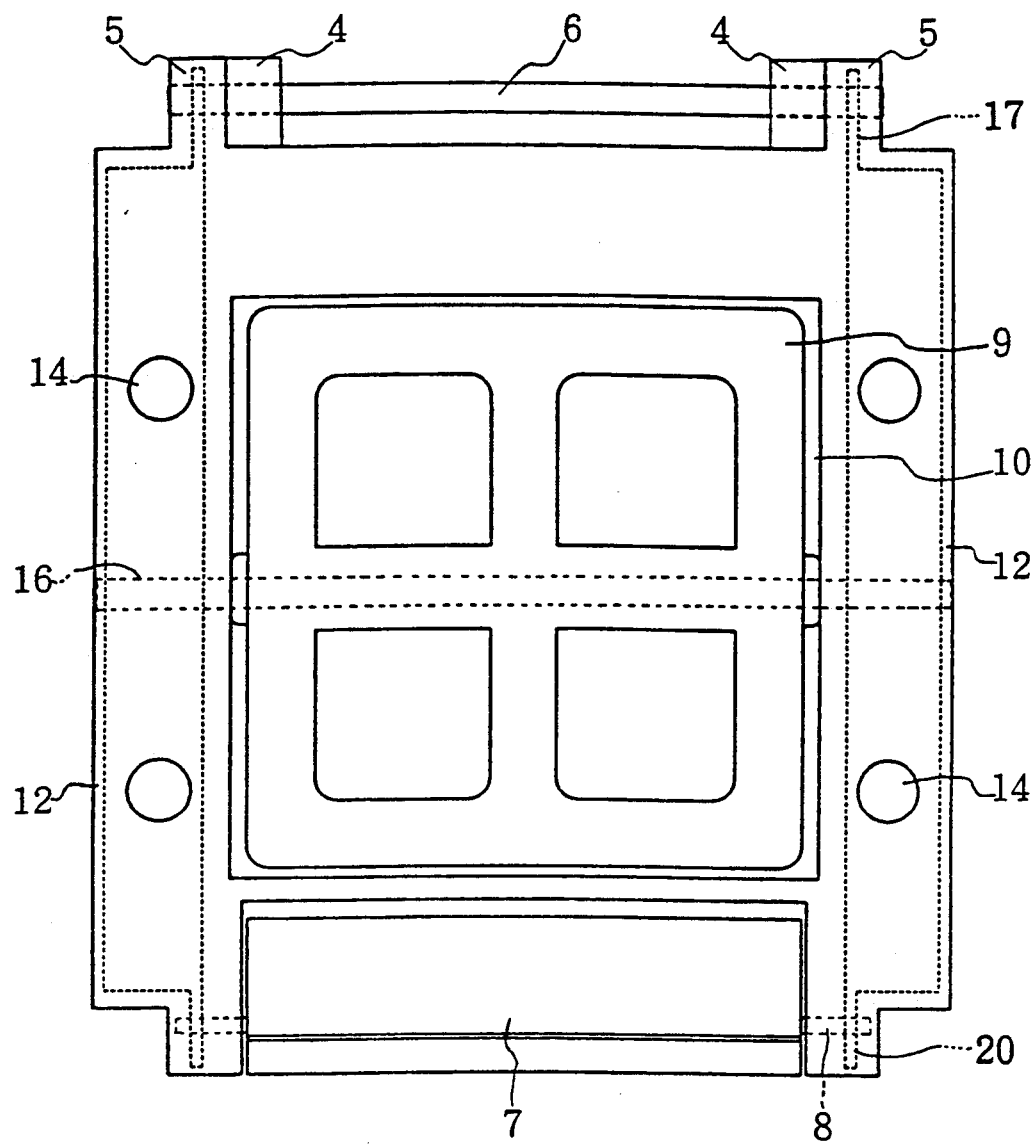
FIG. 5 is a plan view of the socket of FIG. 4.
Figure 6:
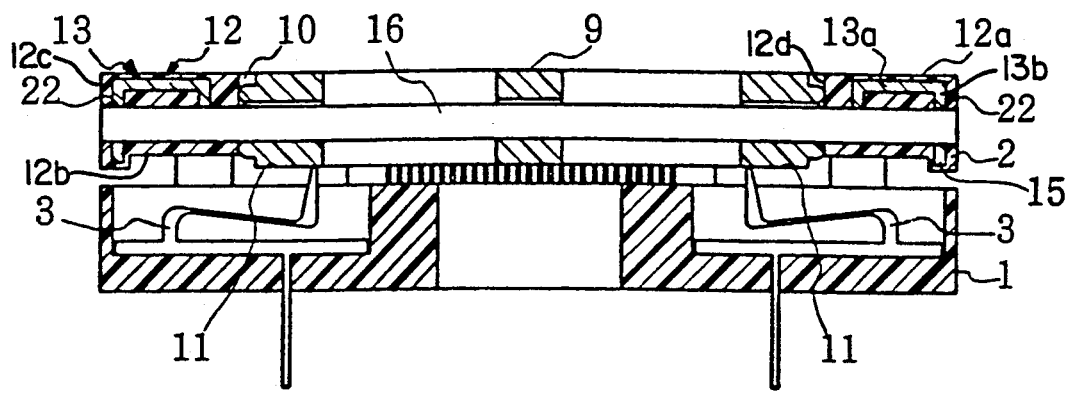
FIG. 6 is a cross sectional view of a bearing portion of a presser member of the socket of FIG. 4.
Figure 7:
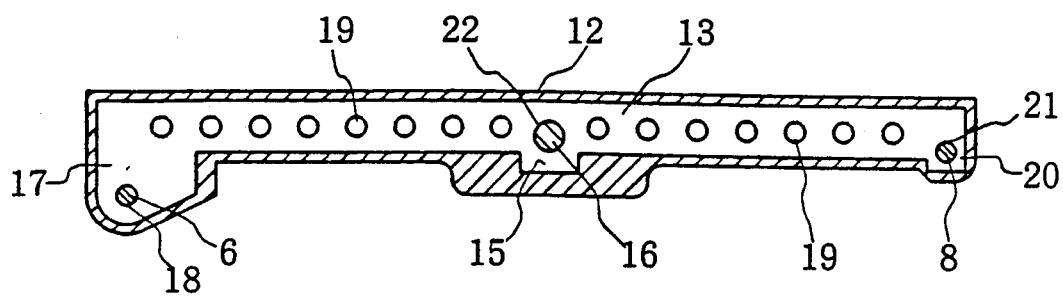
FIG. 7 is a vertical sectional view of a resin frame portion of the socket of FIG. 4.

The presser cover 2 is further provided with a presser means for pushing or urging the leads against their corresponding contacts 3. As is shown in FIG. 3, a pillow-like projection 11 corresponding to the rows of the leads and contacts 3 is integrally formed on the under surface (or closing surface) of the presser cover 2, so that the presser cover 2 itself serves as the presser means. Alternatively, as shown in FIG. 4 to 6, an opening 10 for heat discharging is formed in the presser cover 2 in such a manner as to correspond to a portion of the socket body 1 where the electric part is placed, and the presser means is a presser member 9 having the pillow-like projection 11 corresponding to the rows of the leads and contacts and is formed as a separate part from the presser cover 2, and the presser member 9 is pivotably mounted on an opposing resin frame 12 which forms the opening 10 in the presser cover 2.

A metal frame 13, such as those shown in FIGS. 8 to 10, is integrally provided along each of the two opposite sides of the resin frame 12 in such a manner as to extend from the pivotal hinge end thereof to the free end thereof.

The metal frame 13 is constituted by one part 13a of a U-shaped or L-shaped channel disposed along an upper or lower surface 12a or 12b of the resin frame 12, and a second part 13b thereof disposed along an inner or outer surface 12c or 12d of the resin frame 12. The expression "lower surface" refers to the under surface (or closing surface) of the presser cover 2, the expression "upper surface" refers to a surface opposite thereto, the expression "inner surface" refers to the inner surface defining the opening portion 10, and the expression "outer surface" refers to a surface opposite thereto.

The metal frame 13, as illustrated, is completely embedded (or completely buried) in the resin of frame 12, or partly embedded, by integral molding, therein with a remaining part thereof exposed at a surface thereof. The expression "embedded" also includes such arrangements as that an outer surface of either one or the second part of the metal frame 13 is exposed at both upper and lower surfaces or inner and outer surfaces of the resin frame 12.

In FIGS. 1 to 3, the metal frame 13 is completely embedded in the resin of frame 12 so that the metal frame can serve as a core member of the resin frame 12. The resin frame 12 is provided with an exposing hole 14 opening out of a surface, e.g., upper surface, thereof, and the metal frame 13 is exposed through the hole 14.

In FIGS. 4 to 7, and also in FIGS. 9 and 10, a bearing portion 15 is disposed at a central portion of a side piece of the metal frame 13 disposed along the inner or outer surface thereof, and a bearing hole 22 is formed in this bearing portion 15 in order to support a metal shaft 16 of the presser member 9 disposed within the opening portion 10.

As shown in FIGS. 4, 5, 7, and 10, one end of the metal frame 13 is extended into the joint portion 5 of the pivotal hinge to serve as a bearing portion 17, a bearing hole 18 is formed in the bearing portion 17, and both ends of the metal shaft 6 forming part of the pivotal hinge of the presser cover 2 are carried in this bearing hole 18.

As shown in FIGS. 4, 5, 7, and 10, a bearing portion 20 is formed at the other end of the metal frame 13, and a bearing hole 21 is formed in this bearing portion 20, and the shaft 8, which supports the lock member 7, is disposed within the hole 21. The shaft 16, the shaft 6 of the presser member 9, and the shaft 8 of the lock member are directly carried in the bearing holes 18, 22, and 21, respectively, or indirectly carried therein with a resin material covering the inner peripheral surfaces of the bearing holes 18, 22, 21.

The metal frame 13 is provided with a number of connection holes 19, and resin material of the frame 12 extends into the holes 19 in order to reinforce the connection to the resin frame 12. In the case where the shafts 6, 16 and 8 are formed of a metal material, respectively and these shafts are directly supported on the metal frame 13 for achieving a contacting relation, both the members (shafts and frame) are in conductive states with respect to static electricity. Also, the hole 14 can be used as a short hole, etc. for discharging the static electricity. The bearing portions 15, 17 and 20 can selectively be provided either alone or together.

As described previously, there are such problems as that when the presser cover is closed on the socket body to cause the contacts to engage against elasticity thereof, the reaction of these contacts is normally exerted on the presser cover as a push-up force, and as a result, the resin frame forming the opening portion in this presser cover is caused to be warped from the pivotal hinge side thereof toward the free end side thereof, thereby decreasing the reliability of the contact relation, and the socket is obliged to be discharged in a short period of time due to this warping.

Furthermore, this warping is further enhanced when heat of the electric part and a high temperature at the measuring time are applied to the resin frame. This warping also occurs during the molding of the presser cover. According to the present invention, however, since the metal frame is embedded in the resin frame of the presser cover from the pivotal hinge end to the free end, a generation of warping in that direction can be prevented effectively, thereby overcoming the above problems (i.e., warping caused by formation of the heat discharging opening and push-up force applied to each of the contacts). Accordingly, the problem that the reliability of the contact relation is decreased and also the problem that the service life of the socket is decreased are overcome.

Furthermore, by virtue of the metal frame embedded in the resin frame, the metal frame can be used as a bearing portion of a pivotal hinge, etc. of the presser cover, and also as a means for discharging a static electricity.

What is claimed is:

1. A socket for receiving an electric part, comprising:
a socket body of synthetic resin material;
a presser cover of a synthetic resin material;
hinge means hingedly connecting one end of said presser cover to one end of said socket body;
said presser cover having a synthetic resin frame defining an opening therethrough at a position corresponding to a portion where an electric part is to be placed on said socket body;
metal frames embedded only in parts of said synthetic resin frame and extending from said one end having said hinge means thereon towards a free end of said synthetic resin frame, said synthetic resin frame having at least one hole therein extending from a surface of said synthetic resin frame to at least one of said metal frames and through which said at least one metal frame is exposed to said surface of said synthetic resin frame; and
a presser member positioned within said opening in said presser cover and having a shaft on which said presser member is mounted, said shaft extending into said synthetic resin frame and being supported in said metal frames.

2. A socket for receiving an electric part, comprising:
a socket body of synthetic resin material;
a presser cover of a synthetic resin material;
hinge means hingedly connecting one end of said presser cover to one end of said socket body and having a pair of spaced hinge supports on said one end of said presser cover, and a shaft extending between said hinge supports and supported on said socket body;
said presser cover having a synthetic resin frame defining an opening therethrough at a position corresponding to a portion where an electric part is to be placed on said socket body;
metal frames embedded only in parts of said synthetic resin frame and extending from said one end having said hinge means thereon towards a free end of said synthetic resin frame, said synthetic resin frame having at least one hole therein extending from a surface of said synthetic resin frame to at least one of said metal frames and through which said at least one metal frame is exposed to said surface of said synthetic resin frame;
one end portion of each of said metal frames at said one end of said presser cover extending into a corresponding hinge support and supporting said shaft in said hinge supports.

* * * * *